US012764978B2

(12) United States Patent
Bedjaoui

(10) Patent No.: US 12,764,978 B2
(45) Date of Patent: Oct. 13, 2026

(54) PATTERNING A FUNCTIONAL LAYER BY MEANS OF A SACRIFICIAL LAYER AND PREPARING A MIM CAPACITOR IMPLEMENTING SAID PATTERNING

(71) Applicant: COMMISSARIAT A L'ENERGIE ATOMIQUE ET AUX ENERGIES ALTERNATIVES, Paris (FR)

(72) Inventor: Messaoud Bedjaoui, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 336 days.

(21) Appl. No.: 18/650,176

(22) Filed: Apr. 30, 2024

(65) Prior Publication Data

US 2024/0371923 A1 Nov. 7, 2024

(30) Foreign Application Priority Data

May 2, 2023 (FR) ...................................... 2304397

(51) Int. Cl.
*H10D 1/00* (2025.01)
*H10D 1/68* (2025.01)

(52) U.S. Cl.
CPC ............. *H10D 1/043* (2025.01); *H10D 1/042* (2025.01); *H10D 1/716* (2025.01)

(58) Field of Classification Search
CPC .......... H10D 1/043; H10D 1/042; H10D 1/68; H10D 1/716; H10P 14/61; H10P 14/6339; H10P 14/69392; H10P 14/69394
See application file for complete search history.

(56) References Cited

U.S. PATENT DOCUMENTS

2011/0269660 A1* 11/2011 Miralles ............... C11D 3/0073
510/219
2014/0377963 A1 12/2014 Ellinger et al.
(Continued)

FOREIGN PATENT DOCUMENTS

CN 112458428 B * 7/2022 ............. B82Y 40/00
CN 116801684 A * 9/2023 ............. H10K 71/00
(Continued)

OTHER PUBLICATIONS

Preliminary French Search Report issued Dec. 6, 2023 in French Application 2304397 filed on May 2, 2023, 10 pages (with English Translation of Categories of Cited Documents & Written Opinion).
(Continued)

*Primary Examiner* — Edward Chin
(74) *Attorney, Agent, or Firm* — Oblon, McClelland, Maier & Neustadt, L.L.P.

(57) ABSTRACT

The invention relates, firstly, to a method for patterning a functional layer (130), comprising at least the following steps of:

- providing a substrate (110) having a surface locally covered by a so-called sacrificial layer (120), one or more areas of the surface of the substrate (110) being devoid of the sacrificial layer (120);
- selectively growing the functional layer (130) on the area(s) of the surface of the substrate (110) devoid of the sacrificial layer (120);
- eliminating the sacrificial layer (120);

whereby the surface of the substrate (110) is covered by a patterned functional layer (130).

Subsequently, the invention relates to a method for preparing a MIM capacitor, implementing the patterning method for patterning at least one layer of the capacitor.

(Continued)

Applications: micro- and nano-electronic devices such as electronic chips, manufacturing of high-density MIM capacitors.

15 Claims, 4 Drawing Sheets

(56) References Cited

U.S. PATENT DOCUMENTS

| | | | | |
|---|---|---|---|---|
| 2016/0240429 | A1 | 8/2016 | Engelhardt | |
| 2019/0322812 | A1* | 10/2019 | Wojtecki | C08G 79/04 |
| 2026/0144047 | A1* | 5/2026 | Su | H10P 14/6548 |

FOREIGN PATENT DOCUMENTS

| | | | | | |
|---|---|---|---|---|---|
| JP | 2008-177230 | A | | 7/2008 | |
| JP | 2014067603 | A | * | 4/2014 | |
| KR | 20080016882 | A | * | 2/2008 | G01N 33/54353 |
| KR | 20080042081 | A | * | 5/2008 | H01M 10/05 |

OTHER PUBLICATIONS

Feng et al., "Designing high k dielectric films with LiPON—$Al_30_2$ hybrid structure by atomic layer deposition", Chin. Phys. B, 2022, 5 pages.

* cited by examiner

PATTERNING A FUNCTIONAL LAYER BY MEANS OF A SACRIFICIAL LAYER AND PREPARING A MIM CAPACITOR IMPLEMENTING SAID PATTERNING

TECHNICAL FIELD

The invention relates to the field of micro- and nano-technologies and more specifically to the field of the production of micro- and nano-electronic devices.

More particularly, the invention relates, firstly, to a method for patterning a functional layer by means of a so-called sacrificial layer.

Another object of the invention is a method for preparing a Metal-Insulator-Metal (MIM) capacitor by implementing a method for patterning a functional layer of the capacitor by means of a sacrificial layer.

The invention also applies to micro- and nano-technology and more specifically to the manufacturing of high-density capacitors such as MIM capacitors for example for electronic chips.

PRIOR ART

The advent of intelligent and connected objects is currently the subject of research and particularly research on highly advanced and increasingly complex micro- and nano-electronic devices.

Apart from the developments related to the architecture and to the design of micro- and nano-electronic components for meeting technological criteria and highly advanced performance, the patterning of the material with submicronic and nanometric sizes is one of the key points in the manufacturing of such technologies.

MIM capacitors—corresponding to a stack of a dielectric layer nested (or comprised) between two electrodes—represent one of the main components of these micro- and nano-electronic devices.

In order to pattern or delimit the deposition of material layers during the manufacturing of such components, photolithographic and etching methods are generally implemented.

However, with the race to miniaturise micro- and nano-electronic devices, we assist in multiplying the number of steps in the photolithographic and etching methods as well as a complexification of these steps, for example by implementing a Litho Etch Litho Etch (LELE) method or a Self-Aligned Double Patterning (SADP) method.

Yet, the multiplication and the complexification of these steps, not only, increase the risk of misalignment of the material layers forming the components of the micro- and nano-electronic devices, which leads to a loss of efficiency, but also, increase the cost of manufacturing these micro- and nano-electronic devices, particularly due to the need to use increasingly expensive equipment.

Therefore, there is a need to develop a new method for patterning material layers making it possible to reduce the number of steps in the manufacturing of components for micro- and nano-electronic devices, in comparison to already known methods.

DISCLOSURE OF THE INVENTION

The aim of the invention is to provide such a method.

Therefore, the object of the invention is, firstly, a method for patterning a functional layer, comprising at least the following steps of:

a) providing a substrate having a surface locally covered by a so-called sacrificial layer made of a lithiated material, one or more areas of the surface of the substrate being devoid of the sacrificial layer;

b) selectively growing the functional layer on the area(s) of the surface of the substrate devoid of the sacrificial layer, the functional layer being obtained from a halogenated precursor comprising chlorine, iodine or bromine, preferably chlorine;

c) eliminating the sacrificial layer;

whereby the surface of the substrate is covered by a patterned functional layer.

It is specified that, hereinabove and hereinafter, "patterning" means the fact of selectively delimiting the deposition of a layer on a predetermined area and, advantageously, the fact of giving it the form of a desired design.

Moreover, hereinabove and hereinafter, "growth" means the fact that the functional layer can be deposited and grow on the surface of an underlying material, so as to have a homogeneous desired thickness on this entire surface.

The invention is fundamentally different from the prior art by the implementation of a sacrificial layer. The sacrificial layer is made of a material that delays, or even, prevents, the growth of the functional layer. The growth rate of the functional layer on the sacrificial layer is zero or slower than the growth rate of the functional layer on the substrate. When the precursors of the functional layer are deposited on the sacrificial layer, an interaction between the compounds present in the sacrificial layer and these precursors takes place, therefore resulting in a delay or even absence of growth of the first atomic layers of the functional layer.

Thus, the area(s) of the surface of the substrate that are devoid of the sacrificial layer make it possible to obtain areas favourable to the growth of the functional layer, whereas the area(s) covered by the sacrificial layer are so-called areas unfavourable to the growth of the functional layer.

Advantageously, the sacrificial layer is made of lithium oxide or lithium oxynitride, for example selected from LiPON, $Li_2SiO_3$, LiPO, LiSiPON, $LiAlO_2$, LiOH, $Li_2O$ and $Li_2CO_3$, preference however being given to LiPON.

According to a first embodiment of the invention, the functional layer may be an electric layer (also called conductive layer) made of a metal nitride such as titanium nitride, tantalum nitride, molybdenum nitride or tungsten nitride, preference however being given to titanium nitride. For example, a TiN layer obtained from a halogenated precursor has a low electrical resistivity, typically an electrical resistivity generally less than 500 $\mu\Omega$ cm. Such a layer may be used as an electrode in a MIM capacitor.

According to a second embodiment of the invention, the functional layer may be a dielectric layer made of metal oxide, preferably selected from hafnium oxide, silicon oxide, zirconium oxide and titanium oxide, preference however being given to hafnium oxide. Such a layer may be used as an electrically insulating layer in a MIM capacitor.

In accordance with the invention, step a) of the method comprises, preferably, the following substeps of:

i) depositing the sacrificial layer on all or part of the surface of the substrate, preferably by the Atomic Layer Deposition (ALD) technique;

ii) partially eliminating the sacrificial layer in predetermined locations by plasma etching, wet etching or laser etching, preference being given to plasma etching.

More particularly, the sacrificial layer is deposited, preferably, by ALD, generally at a temperature between 200° C. and 450° C., for example at 300° C. and under a vacuum (from a few mTorr to a few Torr; i.e. between 0.1 Pa and a few hundreds of Pa, for example 300 Pa) which particularly makes it possible to obtain very conformable layers, of very high purity and of very low thickness.

The principle of ALD lies in the fact of introducing into an ALD chamber at least two reactive species, known as "precursors", then of alternately circulating them on the surface of a material.

The choice of precursors depends on the desired nature of the layer to be deposited.

For example, in order to deposit a sacrificial layer made of lithiated material, the precursors generally used are lithium hexamethyldisilazanede (denoted LiHMDS) coupled with dietyl phosphoramidate (denoted DEPA), lithium tert-butoxide (denoted LiOtBu) coupled with DEPA or also LiOtBu coupled with trimethyl phosphite (denoted TMPO) to obtain a layer made of lithium phosphorus oxynitride (or LiPON).

It is also possible to use, for example, LiOtBu coupled with tetraethyl orthosilicate (denoted TEOS) and water that makes it possible to obtain a layer made of lithium metasilicate (or $Li_2SiO_3$).

After the alternate introduction and circulation of each of the precursors, a step of purging the latter is generally implemented, for example for a duration of at least 35 seconds, in order to eliminate the excess precursors and any undesired by-products, obtained during a reaction between the precursors.

Moreover, the alternate introduction and circulation can be repeated a certain number of times until a desired thickness is obtained.

According to the invention, the sacrificial layer thus deposited on all or part of the surface of the substrate typically has a thickness between 1 nm and 50 nm and, more generally, between 1 nm and 5 nm, for example equal to 2 nm. This low thickness is sufficient to inhibit the growth of the overlying layer obtained from a halide.

Such a sacrificial layer comprising lithium is advantageously used within the scope of the invention because it has the advantage of being easily eliminated by standard etching solutions such as plasma etching.

Thus, it is possible to implement substep ii) by plasma etching, for example with fluorinated plasma (which may comprise trifluoromethane) or chlorinated plasma (which may comprise chlorine) and by using a hard mask made of a suitable material, such as titanium, aluminium or nickel and a barrier layer for example a layer made of silicon oxide, having one or more designs so as to, on the one hand, protect certain portions of the underlying layer and, on the other hand, expose others to the plasma.

Thus, the portions protected by the hard mask and the barrier layer are not attacked by the plasma and therefore are not eliminated, whereas the portions not being protected by the hard mask and the barrier layer are attacked and therefore eliminated by the plasma etching.

This substep of partial elimination thus makes it possible to obtain and select the area(s) of the surface devoid of the sacrificial layer. In other terms, this substep makes it possible to select the area(s) favourable and the area(s) unfavourable to the growth of the functional layer, which, consequently, makes it possible to selectively delimit and locate the deposition of material layers and particular of layers obtained from at least one halide.

In addition, it is preferred that step b) is carried out by ALD. At least one of the precursors of the functional layer is a halide comprising chlorine, iodine or bromine, preference being given to chlorine.

When the functional layer is an electric layer made of a metal nitride, ALD is typically performed at a temperature between 200° C. and 450° C., for example at 400° C.

As mentioned above, the precursors used during ALD are chosen depending on the desired nature of the layer. For example, titanium tetrachloride ($TiCl_4$) may be coupled with ammonia to obtain an electric layer made of titanium nitride (TiN).

When the functional layer is a dielectric layer made of a metal oxide, ALD may be performed at a temperature between 200° C. and 450° C., for example at 300° C.

For example, the precursors generally used to obtain a layer made of hafnium oxide are hafnium tetrachloride ($HfCl_4$) coupled with water.

It is also possible to use as precursors silicon tetrachloride ($SiCl_4$) coupled with water to obtain a dielectric layer made of silicon oxide or also zirconium tetrachloride ($ZrCl_4$) coupled with water to obtain a layer made of zirconium oxide or titanium tetrachloride ($TiCl_4$) coupled with water to obtain a layer made of titanium oxide.

A person skilled in the art will know how to perfectly adapt the precursor(s) comprising halide depending on the nature of the desired functional layer.

Usually, during the ALD of a functional layer, the introduction of each of the precursors is followed by a so-called waiting time before performing a purge thereof.

The waiting time represents the residence time of the precursors at the surface of the substrate or, if applicable, at the surface of an underlying layer. The waiting time makes it possible to make the precursors diffuse and react optimally, particularly in complex structures comprising for example a substrate with a micropatterned surface.

Within the scope of the invention, the waiting time may for example be set between 15 seconds and 100 seconds and more particularly set at 30 seconds whereas the purge may be implemented for example for at least 35 seconds.

As for the sacrificial layer, the alternate introduction and circulation of the precursors, making it possible to deposit the functional layer, may be repeated a certain number of times until a desired thickness of the layer is obtained.

Within the scope of the invention, the functional layer is an ultra-thin layer and may have a thickness between 3 nm and 100 nm, more generally between 5 nm and 20 nm, for example equal to 10 nm.

Furthermore, in accordance with the invention, step c) of the method consisting in eliminating the sacrificial layer is, preferably, carried out by plasma etching, wet etching or laser etching, preference being given to plasma etching, and even more preferably to plasma etching that comprises fluorine, such as trifluoromethane, or that comprises chlorine, preference being given to fluorine.

Such etching techniques make it possible to easily eliminate the sacrificial layer without in as much altering the properties of any other functional layer present on the substrate.

It should be noted that the sacrificial layer has the role of delaying or even inhibiting the growth of the functional layer, a very low thickness of this functional layer is therefore likely to be deposited on the sacrificial layer. However, this would in no way be detrimental to the method of the invention since the deposited functional layer would be eliminated at the same time as the sacrificial layer during step c), due to its very low thickness. Very low thickness means a thickness less than 3 nm and, even better, less than 1 nm.

Moreover, the surface of the substrate may for example be flat—that is to say in two dimensions—or may comprise one or more flat zones and one or more micropatterned zones—that is to say in three dimensions.

Hereinabove and hereinafter, "micropatterned zone" means a zone of the surface comprising pores or vias, for example of elongated shape, which particularly makes it possible to increase the specific surface of the substrate—that is to say the surface of the substrate intended particularly to be covered by the functional layer—in comparison to the flat zone.

Thus, a surface comprising one or more flat zones and one or more micropatterned zones may have a more or less high aspect ratio, this aspect ratio corresponding in relation to the longitudinal dimension to the transverse dimension of the pores or of the vias. Also, the higher the aspect ratio, the larger the specific surface of the substrate. For example, an aspect ratio higher than 20 may be considered.

More particularly, it is preferred that the surface of the substrate comprises one or more flat zones and one or more micropatterned zones. In this case, the surface of the substrate is advantageously covered by the sacrificial layer only on its flat zone(s) whereas the micropatterned zone(s) are devoid of the sacrificial layer, consequently the growth of the functional layer (step b) of the method) will be carried out selectively on the micropatterned zones.

Generally, the substrate may be made of silicon, of metal nitride or of a material based on metal oxide such as alumina or any other suitable material.

The method is particularly advantageous in the context of manufacturing MIM capacitors, since it makes it possible to reduce the number of steps of manufacturing a structure such as a MIM capacitor.

In particular, the method may be implemented to pattern at least one of the electrodes of the MIM capacitor and/or to pattern the electrically insulating layer of the MIM capacitor.

Another object of the invention is a method for preparing a Metal-Insulator-Metal capacitor that comprises at least the following steps of:

- patterning an electric functional layer (first electrode, also called lower electrode) by implementing the method as defined above;
- depositing a dielectric layer;
- depositing another electric layer (second electrode, also called upper electrode), identical to or different from the first electric functional layer, preferably identical.

In accordance with the preparation method defined above, the electric functional layer may be made of a metal nitride, such as titanium nitride, tantalum nitride, molybdenum nitride or tungsten nitride, this layer being obtained from a halide.

In this particular case, the dielectric layer and the other electric layer (second electrode) are not necessarily obtained from a halide, it being understood that they are not intended to be patterned.

For example, the dielectric layer may be made of a high permittivity material, such as hafnium oxide, silicon oxide, zirconium oxide or titanium oxide or it may be an ionic dielectric layer, for example, made of LiPON, LiSiPON, $LiAlO_2$, LATP or made of a so-called LGPS, LPS or also LLZO material.

The other electric layer (second electrode), for its part, may for example be made of a metal nitride, identical to or different from that of the electric functional layer. Thus, the functional layer of the MIM capacitor obtained is patterned, particularly thanks to the phenomenon of delay or absence of growth of this functional layer due to the presence of the sacrificial layer.

Another object of the invention is a method for preparing a Metal-Insulator-Metal capacitor that comprises at least the following steps of:

- patterning a dielectric functional layer by implementing the method as defined above, the substrate provided in step a) comprising a support substrate and a first electric layer (first electrode), the first electric layer being locally covered by the sacrificial layer,
- depositing a second electric layer (second electrode) on the dielectric functional layer thus structured, the second electric layer being identical to or different from the first electric layer, preferably identical.

In accordance with the method defined above, the first and the second electric layer are not necessarily obtained from a halide. They may be identical or different, made of a metal such as titanium, platinum, tungsten, ruthenium, or molybdenum or made of a metal nitride such as titanium nitride, tantalum nitride, tungsten nitride or molybdenum nitride.

Another object of the invention is a method for preparing a Metal-Insulator-Metal capacitor that comprises at least one step corresponding to patterning an electric functional layer (second electrode) by implementing the method as defined above, the substrate provided in step a) comprising successively a support substrate, a first electric layer (first electrode) and a dielectric layer, the first electric layer being identical to or different from the electric functional layer, preferably identical and the dielectric layer being locally covered by the sacrificial layer.

In accordance with the method defined above, the first electric layer and the dielectric layer are not necessarily obtained from a halide.

For example, the first electric layer may be made of a metal such as titanium, platinum, tungsten, ruthenium, or molybdenum or made of a metal nitride such as titanium nitride, tantalum nitride, tungsten nitride or molybdenum nitride.

The dielectric layer, for its part, may be made of a high permittivity material, such as hafnium oxide, silicon oxide, zirconium oxide or titanium oxide or it may be an ionic dielectric layer, for example, made of LiPON, LiSiPON, $LiAlO_2$, LATP or made of a so-called LGPS, LPS or also LLZO material.

It should be noted that, according to the methods for preparing MIM capacitors and in the case where the structure of the substrate comprises one or more flat zones and one or more micropatterned zones, then the MIM capacitor is only obtained on the micropatterned zone(s).

Moreover, during a method for preparing a MIM capacitor, the deposition of each of the layers is advantageously performed by the ALD technique such as described above, by adapting the precursors depending on the desired nature of the layers to be deposited.

Alternately to ALD, Plasma Enhanced Atomic Layer Deposition (PEALD), Spatial Atomic Layer Deposition (SALD) or also atmospheric pressure ALD may be implemented.

Other alternatives may be implemented, such as deposition techniques adapted to thin layers, such as Physical Vapour Deposition (PVD) or also such as Chemical Vapour Deposition (CVD).

The person skilled in the art knows perfectly how to select the most suitable deposition method depending on the surface of the substrate used (flat and/or micropatterned zones).

It should be noted that it is also possible to pattern a plurality of functional layers of a MIM capacitor in the same method, it being understood that these functional layers are all obtained from at least one halide.

For example, to provide a MIM capacitor by patterning a first electric functional layer and a second dielectric functional layer, it is possible to perform the following steps of:

- providing a substrate having a surface locally covered by a sacrificial layer, one or more areas of the surface of the substrate being devoid of the sacrificial layer;
- growing the first electric functional layer selectively on the area(s) of the surface of the substrate devoid of the sacrificial layer;
- growing the second dielectric functional layer selectively on the area(s) of the surface of the substrate devoid of the sacrificial layer;
- eliminating the sacrificial layer; and
- depositing another electric layer, identical to or different from the first electric functional layer.

It goes without saying that depending on the functional layers to be patterned in a MIM capacitor, the person skilled in the art is perfectly capable of adapting the patterning method as defined above.

The invention is particularly advantageous for patterning ultra-thin layers (typically having thicknesses less than 50 nm), and/or for structures having micropatterned surfaces, that is to say very large developed surfaces having an aspect ratio higher than 20 or even higher than 50. The invention is particularly advantageous for manufacturing MIM structures formed of ultra-thin layers.

Nevertheless, the invention may be implemented to pattern layers having thicknesses that may reach up to 100 nm. Other features and advantages of the invention will become apparent from the following additional description.

It goes without saying that this additional description is given only as an illustration of the object of the invention and should in no way be interpreted as a limitation of this object.

It should be noted that the figures described above are schematic representations of which the dimensions and proportions relative to the substrates and to any of the layers are not representative of those likely to be presented in real situations and this, for readability reasons.

DETAILED DISCLOSURE OF PARTICULAR EMBODIMENTS

Example 1: Patterning an Electric Functional Layer Made of Tin 1.1—Deposition of a Sacrificial Layer Made of LiPON:

A substrate 110 is placed in a vacuum ALD chamber, at 0.3 Pa, dedicated to the deposition of ionic dielectric layers.

The substrate 110 is made of silicon with an electrical insulation made of silicon oxide and has a flat surface.

ALD is implemented at a temperature of 300° C. by performing 20 times the cycle of the following steps:

injecting and circulating LiHMDS on the surface of the substrate 110 for an injection time equal to 4 seconds;

purging for 35 seconds the excess LiHMDS; then injecting and circulating DEPA on the surface of the substrate 110 for an injection time equal to 2 seconds;

purging for 35 seconds the excess DEPA as well as any by-products obtained during a reaction between LiHMDS and DEPA.

Figure 1:
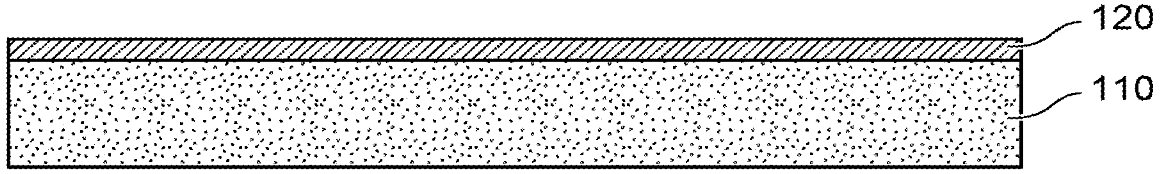
FIG. 1 shows a substrate 110 having a flat surface covered with a sacrificial layer 120, according to a step of a method for manufacturing a patterned electric layer according to the first example of embodiment of the invention.

Thus, a sacrificial layer 120 made of LiPON, of a thickness of 2 nm, is homogeneously deposited on the entire surface of the substrate 110, as illustrated in FIG. 1.

1.2—Partial Elimination of the Sacrificial Layer Made of LiPON:

The assembly formed by the substrate 110 and the sacrificial layer 120 made of LiPON is placed in a chamber under a pressure of 1 Pa.

A hard mask made of titanium and a barrier layer made of $SiO_2$ are placed on the surface of the sacrificial layer 120.

A plasma etching method, with a $CHF_3$-based fluorinated plasma is implemented for 10 seconds and then the mask and the barrier layer are removed.

Thus, the portions of the sacrificial layer 120 made of LiPON not covered by the hard mask and the barrier layer are eliminated by the etching whereas the portions protected by the mask and the barrier layer have not been attacked by the plasma and therefore have not been eliminated by the etching.

Figure 2:
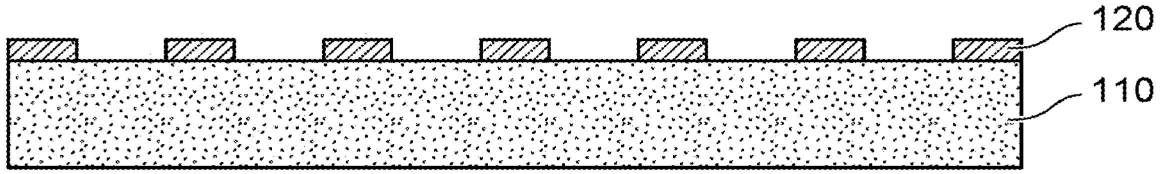
FIG. 2 shows a structure comprising the substrate 110 of which its surface is locally covered by the sacrificial layer 120 made of LiPON.

A structure comprising the substrate 110 of which its surface is locally covered by the sacrificial layer 120 made of LiPON with a design such as shown in FIG. 2, is obtained.

1.3—Growth of the Electric Functional Layer Made of TiN:

While remaining under a vacuum, the assembly formed by the substrate 110 and the sacrificial layer 120, such as obtained in point 1.2, is moved to an ALD chamber dedicated to the deposition of electrode layers.

ALD is implemented at a temperature of 400° C. by alternately introducing and circulating $TiCl_4$ and $NH_3$ on the assembly formed by the substrate 110 and the sacrificial layer 120 obtained in point 1.2.

The alternate introduction and circulation of $TiCl_4$ and of $NH_3$ are each implemented and repeated 200 times, with an injection time of 2 seconds and by respecting a waiting time of 30 seconds and a purge of 35 seconds.

Thus, the electric functional layer 130 made of TiN, of a thickness of 10 nm, is deposited on the surface of the assembly formed by the substrate 110 and the sacrificial layer 120 obtained in point 1.2.

Figure 3:
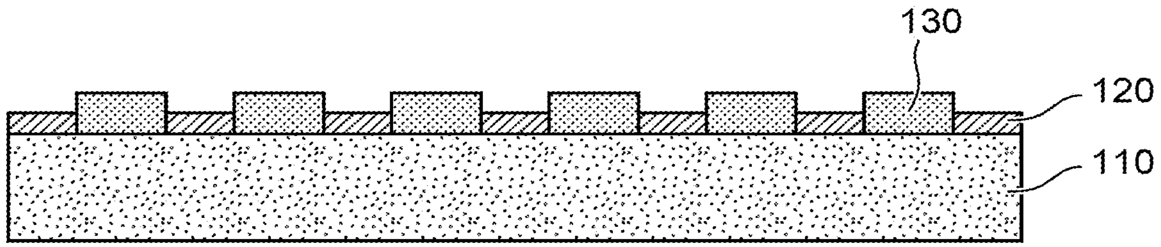
FIG. 3 shows a structure comprising the substrate 110 of which its surface is locally covered on the one hand, by the sacrificial layer 120 and, on the other hand, by an electric functional layer 130, according to another step of the method for manufacturing a patterned electric layer according to the first example of embodiment of the invention.

This functional layer 130 is ultimately only present on the areas of the surface of the substrate 110 that are devoid of the sacrificial layer 120, as illustrated in FIG. 3, since the layer 120 made of LiPON inhibits the growth of the electric functional layer 130.

1.4—Elimination of the Sacrificial Layer Made of LiPON:

The assembly obtained in point 1.3 above is placed in a chamber under a pressure of 1 Pa.

A plasma etching method, with a $CHF_3$-based fluorinated plasma, is implemented for 10 seconds, thus eliminating the entire sacrificial layer 120 made of LiPON.

Figure 4:
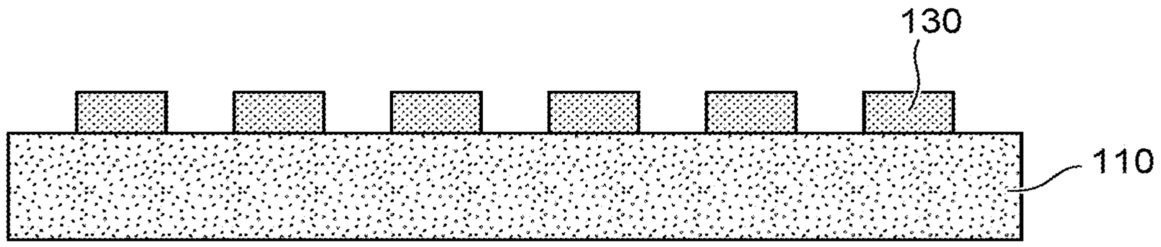
FIG. 4 shows a structure comprising the substrate 110 of which its surface is locally covered by the electric functional layer 130, according to another step of the method for manufacturing a patterned electric layer according to the first example of embodiment of the invention.

Thus, a structure such as illustrated in FIG. 4 is obtained. This structure comprises the substrate 110 of which its surface is locally selectively covered by the electric functional layer 130 made of TiN.

Example 2: Preparing a First MIM Capacitor by Patterning its Electric Functional Layer Made of Tin 2.1—Deposition of a Sacrificial Layer Made of LiPON:

A substrate 210 is placed in a vacuum ALD chamber, dedicated to the deposition of ionic dielectric layers.

The substrate 210 is made of silicon electrically insulated with a silicon oxide. It has a surface comprising flat zones and micropatterned zones so as to give it an aspect ratio higher than 20.

ALD is implemented at a temperature of 300° C. by alternately introducing and circulating LiHMDS and DEPA on the surface of the substrate 210.

The alternate introduction and circulation of LiHMDS and of DEPA are each implemented and repeated 20 times, with an injection time of 4 seconds.

A purge is performed for 35 seconds after each alternate introduction and circulation of LiHMDS and of DEPA.

A sacrificial layer 220 made of LiPON of a thickness of 2 nm is thus obtained.

Figure 5:
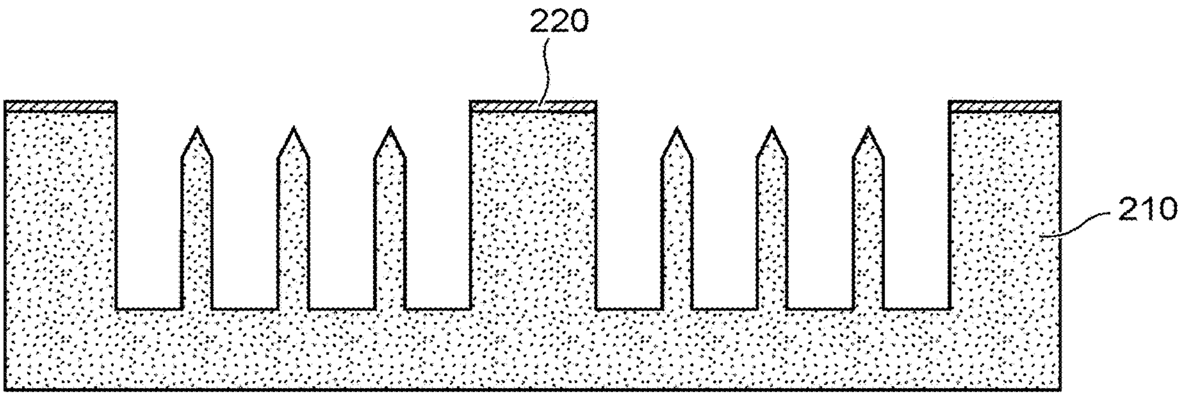
FIG. 5 shows a substrate 210 having a surface comprising flat zones and micropatterned zones and of which only the flat zones are covered by a sacrificial layer 220, according to a step of a method for manufacturing a MIM structure according to a second example of embodiment of the invention.

Due to the high aspect ratio (higher than 20) of the substrate 210, the sacrificial layer 220 made of LiPON is only deposited on the flat zones of this surface, such as shown in FIG. 5.

Also, by using such a substrate and ALD with the conditions described above, the deposition of the sacrificial layer 220 is performed in a localised way. No partial elimination step, for example by plasma etching, is necessary. However, it may be possible to carry out such a step on the flat zones of the substrate 210, in order to obtain new areas of the surface of the substrate 210 devoid of the sacrificial layer 220.

2.2—Growth of the Electric Functional Layer Made of TiN (First Electrode);

While remaining under a vacuum, the assembly formed by the substrate 210 and the sacrificial layer 220, such as obtained in point 2.2, is moved to an ALD chamber dedicated to the deposition of electrode layers.

ALD is implemented with the same conditions as those described in point 1.3 above.

Figure 6:
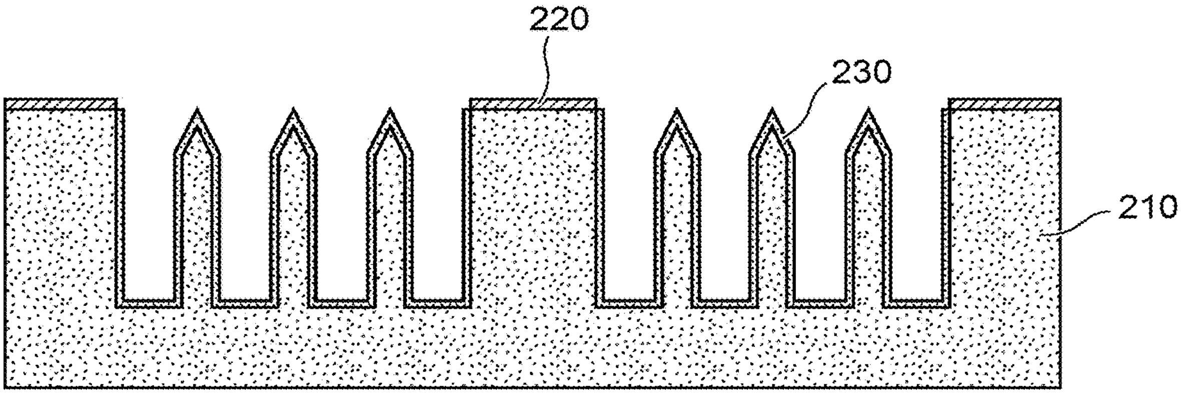
FIG. 6 shows a structure comprising the substrate 210 of which the flat zones of its surface are covered by the sacrificial layer 220 and of which the micropatterned zones of its surface are covered by an electric functional layer 230, according to another step of the method for manufacturing a MIM structure according to the second example of embodiment of the invention.

Thus, as shown in FIG. 6, the electric functional layer 230 made of TiN, of a thickness of 10 nm, is selectively deposited on the micropatterned zones of the surface of the substrate 210, the flat zones of this surface comprising the sacrificial layer that inhibits the growth of the functional layer 230.

2.3—Elimination of the Sacrificial Layer Made of LiPON:

The assembly obtained in point 2.2 above is placed in a chamber under a pressure of 1 Pa.

A plasma etching method, with a $CHF_3$-based fluorinated plasma, is implemented for 10 seconds, thus eliminating the entire sacrificial layer 220 made of LiPON.

Figure 7:
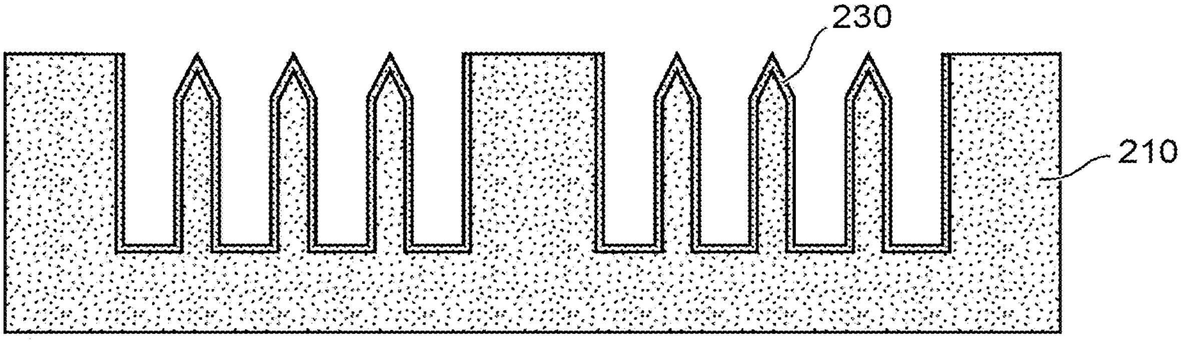
FIG. 7 shows a structure comprising the substrate 210 of which only the micropatterned zones of its surface are covered by the electric functional layer 230, according to another step of the method for manufacturing a MIM structure according to the second example of embodiment of the invention.

A structure such as illustrated in FIG. 7 is obtained. This structure comprises the substrate 210 of which only the micropatterned zones of its surface are covered by the electric functional layer 230 made of TiN.

2.4—Deposition of a Dielectric Layer Made of $HfO_2$:

While remaining under a vacuum, the assembly formed by the substrate 210 and the electric functional layer 230 made of TiN, such as obtained in point 2.3 above, is moved to an ALD chamber dedicated to the deposition of dielectric layers.

ALD is implemented at a temperature of 300° C. by alternately introducing and circulating $HfCl_4$ and water on the assembly formed in point 2.3.

The alternate introduction and circulation of $HfCl_4$ and of water are each implemented and repeated 165 times, with an injection time of 2 seconds and by respecting a waiting time of 30 seconds and a purge of 35 seconds.

Thus, a dielectric layer 240 made of $HfO_2$ of a thickness of 10 nm is deposited on the assembly obtained in point 2.3.

Figure 8:
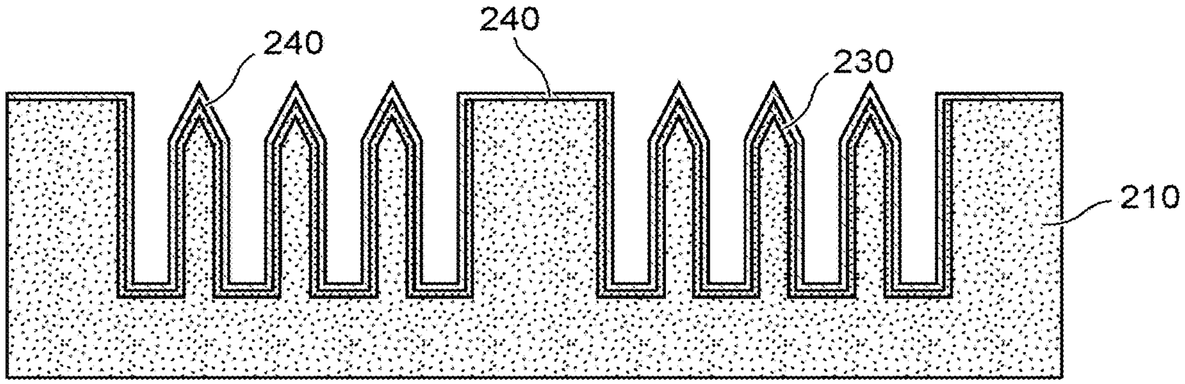
FIG. 8 shows a structure comprising the substrate 210 of which the micropatterned zones of its surface are covered by a stack of the functional layer 230 and of a dielectric layer 240 and of which the flat zones of its surface are only covered by the dielectric layer 240, according to another step of the method for manufacturing a MIM structure according to the second example of embodiment of the invention.

The structure thus obtained is shown in FIG. 8, which comprises the substrate 210 of which the micropatterned zones of its surface are covered by a stack of the functional layer 230 made of TiN and of the dielectric layer 240 made of $HfO_2$ and of which the flat zones of its surface are only covered by the dielectric layer 240 made of $HfO_2$.

2.5—Deposition of an Electric Layer Made of TiN:

While remaining under a vacuum, the assembly formed by the substrate 210, the functional layer 230 made of TiN and the dielectric layer 240 made of $HfO_2$, such as obtained in point 2.4 above, is moved to an ALD chamber dedicated to the deposition of electrode layers.

An electric layer 250 made of TiN, of a thickness of 10 nm, is deposited on the surface of the assembly obtained in point 2.4, by implementing ALD under the same conditions as those described in point 2.2 above.

Figure 9:
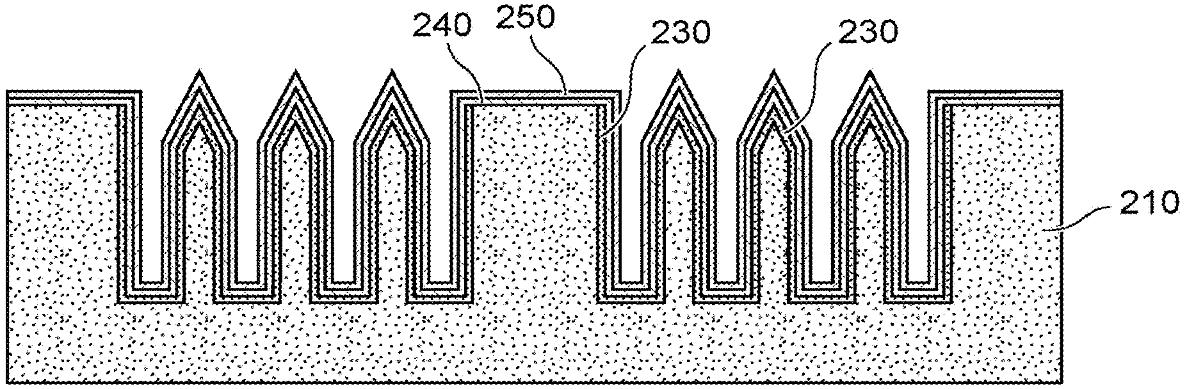
FIG. 9 shows a structure comprising the substrate 210 of which the flat zones of its surface are only covered by a stack of the dielectric layer 240 and of an electric layer 250 and of which the micropatterned zones of its surface are covered by a MIM capacitor, that is to say covered by a stack of the electric functional layer 230, of the dielectric layer 240 and of the electric layer 250, according to another step of the method for manufacturing a MIM structure according to the second example of embodiment of the invention.

Thus, a structure such as shown in FIG. 9 is obtained. This structure comprises the substrate 210 of which the flat zones of its surface are only covered by a stack of the dielectric layer 240 made of $HfO_2$ and of the electric layer 250 made of TiN and of which the micropatterned zones of its surface are covered by a stack of the electric functional layer 230 made of TiN, of the dielectric layer 240 made of $HfO_2$ and of the electric layer 250 made of TiN.

Thus, a MIM capacitor is obtained on the micropatterned zones of the surface of the substrate 210.

Example 3: Preparing a Second MIM Capacitor by Patterning its Dielectric Functional Layer Made of $HfO_2$ and its Electric Functional Layer Made of Tin 3.1—Deposition of a First Electric Layer Made of TiN (First Electrode):

A substrate 1100 is placed in a vacuum ALD chamber, dedicated to the deposition of electric layers.

The substrate 1100 is made of silicon electrically insulated with a silicon oxide and has a flat surface.

ALD is implemented at a temperature of 400° C. by alternately introducing and circulating $TiCl_4$ and $NH_3$ on the surface of the substrate 1100.

The alternate introduction and circulation of $TiCl_4$ and of $NH_3$ are each implemented and repeated 200 times, with an injection time of 2 seconds and by respecting a waiting time of 30 seconds and a purge of 35 seconds.

Thus, a first electric layer 1300 made of TiN, of a thickness of 10 nm, is deposited on the surface of the substrate 1100.

3.2—Deposition of a Sacrificial Layer Made of LiPON:

While remaining under a vacuum, the assembly formed by the substrate 1100 and the first electric layer 1300 made of TiN, such as obtained in point 3.1 above, is moved to an ALD chamber, dedicated to the deposition of dielectric layers.

ALD is implemented under the same conditions as those described in point 1.1.

Thus, a sacrificial layer 1200 made of LiPON of a thickness of 2 nm is deposited on the surface of the first electric layer 1300 made of TiN.

3.3—Partial Elimination of the Sacrificial Layer Made of LiPON:

The assembly formed by the substrate 1100, the first electric layer 1300 made of TiN and the sacrificial layer 1200 made of LiPON, such as obtained in point 3.2, is placed in a chamber under a pressure of 1 Pa.

A plasma etching method is implemented under the same conditions as those described in point 1.2.

Thus, the portions of the sacrificial layer 1200 made of LiPON not covered by the hard mask and the barrier layer are eliminated by the etching whereas the portions protected by the hard mask and the barrier layer have not been attacked by the plasma and therefore have not been eliminated by the etching.

Figure 10:
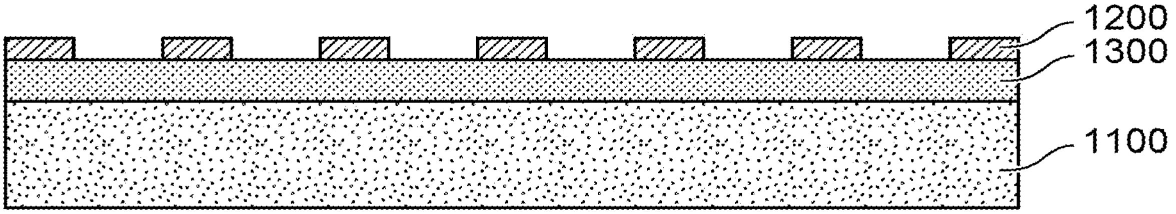
FIG. 10 shows a structure comprising a substrate 1100 of which its surface is covered by a first electric layer 1300 and of which the surface of this electric layer 1300 is locally covered by a sacrificial layer 1200, according to a step of a method for manufacturing a MIM structure according to a third example of embodiment of the invention.

A structure such as shown in FIG. 10 is obtained. It comprises the substrate 1100 of which its surface is covered by the first electric layer 1300 made of TiN and of which the surface of this electric layer 1300 is locally selectively covered by the sacrificial layer 1200 made of LiPON.

3.4—Growth of the Dielectric Functional Layer Made of $HfO_2$ (Electrically Insulating Layer):

While remaining under a vacuum, the assembly formed by the substrate 1100, the first electric layer 1300 made of TiN and the sacrificial layer 1200 made of LiPON, such as obtained in point 3.3 above, is moved to an ALD chamber, dedicated to the deposition of dielectric layers.

ALD is implemented under the same conditions as those described in point 2.4.

Thus, the dielectric functional layer 1400 made of $HfO_2$ of a thickness of 10 nm, is deposited on the areas of the surface of the first electric layer 1300 made of TiN devoid of the sacrificial layer 1200 made of LiPON.

3.5—Growth of the Electric Functional Layer Made of TiN (Second Electrode):

While remaining under a vacuum, the assembly formed by the substrate 1100, the first electric layer 1300 made of TiN, the sacrificial layer 1200 made of LiPON and the dielectric functional layer 1400 made of $HfO_2$, such as obtained in point 3.4 above, is moved to an ALD chamber, dedicated to the deposition of electrode layers.

ALD is implemented under the same conditions as those described in point 3.1.

Thus, the electric functional layer 1500 made of TiN, of a thickness of 10 nm, is deposited on the surface of the dielectric functional layer 1400. It is not deposited on the sacrificial layer.

Figure 11:
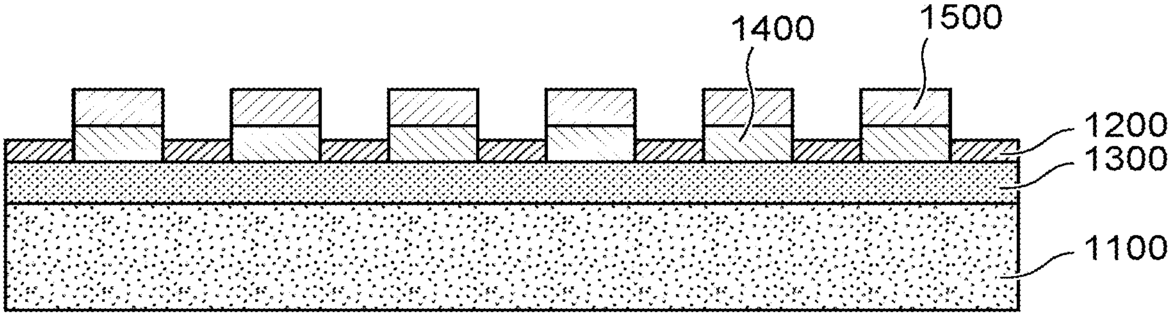
FIG. 11 shows a structure comprising the substrate 1100 of which its surface is covered by the first electric layer 1300, the surface of this electric layer 1300 being locally covered, on the one hand, by the sacrificial layer 1200 and, on the other hand, by a stack of a dielectric functional layer 1400 and of an electric functional layer 1500, according to another step of the method for manufacturing a MIM structure according to the third example of embodiment of the invention.

The structure obtained is shown in FIG. 11.

3.6—Elimination of the Sacrificial Layer Made of LiPON:

The assembly obtained in point 3.5 above is placed in a chamber under a pressure of 1 Pa.

A plasma etching method, with a $CHF_3$-based fluorinated plasma, is implemented for 10 seconds, thus eliminating the entire sacrificial layer 1200 made of LiPON.

Figure 12:
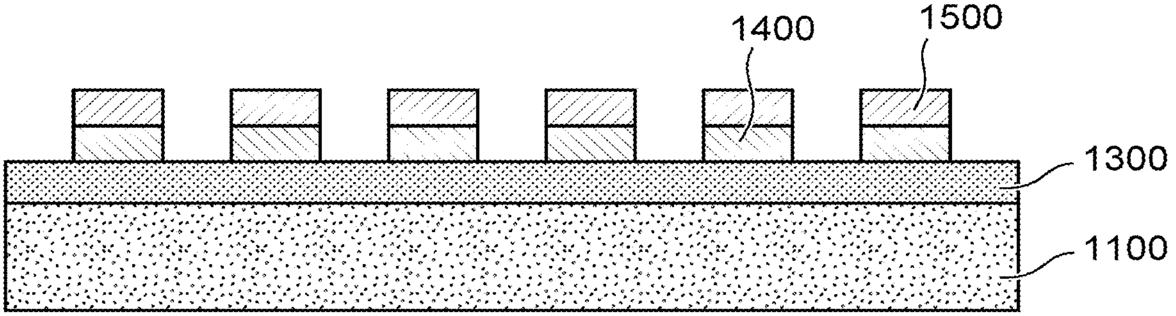
FIG. 12 shows a structure comprising the substrate 1100 of which its surface is covered by the first electric layer 1300, the surface of this electric layer 1300 being locally covered by a stack of the dielectric functional layer 1400 and of the electric functional layer 1500; the areas comprising the stack of these three layers correspond to a MIM capacitor, according to another step of the method for manufacturing a MIM structure according to the third example of embodiment of the invention.

Thus, a structure such as illustrated in FIG. 12 is obtained. It comprises the substrate 1100 of which its surface is covered by the first electric layer 1300 made of TiN, the surface of this electric layer 1300 being locally selectively covered by a stack of the dielectric functional layer 1400 and of the electric functional layer 1500.

A MIM capacitor is thus obtained by the stack of these three layers.

In this example 3, the substrate has a flat surface.

However, the various steps of example 3 may be implemented on a substrate having a micropatterned surface.

The invention claimed is:

1. A method for patterning a functional layer, comprising at least the following steps of:

a) providing a substrate having a surface locally covered by a so-called sacrificial layer made of a lithiated material, one or more areas of the surface of the substrate being devoid of the sacrificial layer;

b) selectively growing the functional layer on the area(s) of the surface of the substrate devoid of the sacrificial layer, the functional layer being obtained from a halogenated precursor comprising chlorine, iodine or bromine;

c) eliminating the sacrificial layer;

whereby the surface of the substrate is covered by the patterned functional layer.

2. The patterning method of claim 1, wherein step a) comprises the following substeps of:

i) depositing the sacrificial layer on all or part of the surface of the substrate;

ii) partially eliminating the sacrificial layer in predetermined locations by plasma etching, wet etching or laser etching.

3. The patterning method of claim 1, wherein the sacrificial layer is made of lithium oxide or lithium oxynitride.

4. The patterning method of claim 3, wherein the lithium oxide or lithium oxynitride is selected from LiPON, $Li_2SiO_3$, LiPO, LiSiPON, $LiAlO_2$, LiOH, $Li_2O$ and $Li_2CO_3$.

5. The patterning method of claim 1, wherein step b) is carried out by ALD.

6. The patterning method of claim 1, wherein the functional layer is an electric layer made of a metal nitride.

7. The patterning method of claim 6, wherein the metal nitride is selected from titanium nitride, tantalum nitride, molybdenum nitride and tungsten nitride.

8. The patterning method of claim 1, wherein the functional layer is a dielectric layer made of a metal oxide.

9. The patterning method of claim 8, wherein the metal oxide is selected from hafnium oxide, silicon dioxide, zirconium oxide and titanium oxide.

10. The patterning method of claim 1, wherein step c) is carried out by plasma etching, wet etching or laser etching.

11. The patterning method of claim 1, wherein the surface of the substrate is flat or comprises one or more flat zones and one or more micropatterned zones.

12. The patterning method of claim 1, wherein the surface of the substrate comprises one or more flat zones and one or more micropatterned zones, the surface of the substrate being covered by the sacrificial layer only on its flat zone(s) whereas the micropatterned zone(s) are devoid of the sacrificial layer.

13. A method for preparing a Metal-Insulator-Metal capacitor that comprises at least the following steps of:

patterning a first electric functional layer by implementing the method such as defined in claim 1;

depositing a dielectric layer;

depositing a second electric layer, identical to or different from the first electric functional layer.

14. A method for preparing a Metal-Insulator-Metal capacitor that comprises at least the following steps of:

patterning a dielectric functional layer by implementing the method such as defined in claim 1, the substrate provided in step a) comprising a support substrate and a first electric layer, the first electric layer being locally covered by the sacrificial layer, depositing a second electric layer on the dielectric functional layer, the second electric layer being identical to or different from the first electric layer.

15. A method for preparing a Metal-Insulator-Metal capacitor that comprises at least one step corresponding to patterning an electric functional layer by implementing the method such as defined in claim 1, the substrate provided in step a) comprising a support substrate, a first electric layer and a dielectric layer, the first electric layer being identical to or different from the electric functional layer, and the dielectric layer being locally covered by the sacrificial layer.

* * * * *